(12) United States Patent
Murin et al.

(10) Patent No.: US 7,952,928 B2
(45) Date of Patent: May 31, 2011

(54) INCREASING READ THROUGHPUT IN NON-VOLATILE MEMORY

(75) Inventors: Mark Murin, Kfar Saba (IL); Mark Shlick, Ganei Tikva (IL)

(73) Assignee: SanDisk IL Ltd., Kfar Saba (IL)

( * ) Notice: Subject to any disclaimer, the term of this patent is extended or adjusted under 35 U.S.C. 154(b) by 281 days.

(21) Appl. No.: 12/127,136

(22) Filed: May 27, 2008

(65) Prior Publication Data

US 2009/0296487 A1    Dec. 3, 2009

(51) Int. Cl.
*G11C 11/34*    (2006.01)

(52) U.S. Cl. ......... 365/185.11; 365/185.12; 365/185.17; 365/185.18; 365/185.21; 365/185.22; 365/185.24

(58) Field of Classification Search ............. 365/185.11, 365/185.17, 185.18, 185.2, 185.21, 185.22, 365/185.29, 185.33, 185.03, 185.12, 185.23
See application file for complete search history.

(56) References Cited

U.S. PATENT DOCUMENTS

| | | | |
|---|---|---|---|
| 4,425,633 A | 1/1984 | Swain | |
| 5,386,422 A | 1/1995 | Endoh et al. | |
| 5,570,315 A | 10/1996 | Tanaka et al. | |
| 5,774,397 A | 6/1998 | Endoh et al. | |
| 5,901,092 A | 5/1999 | Tran | |
| 6,031,764 A | 2/2000 | Imamiya | |
| 6,038,169 A | 3/2000 | Ogura et al. | |
| 6,046,935 A | 4/2000 | Takeuchi et al. | |
| 6,201,757 B1 | 3/2001 | Ward et al. | |
| 6,222,762 B1 | 4/2001 | Guterman et al. | |
| 6,456,528 B1 | 9/2002 | Chen | |
| 6,493,268 B1 | 12/2002 | Khouri et al. | |
| 6,501,695 B1 | 12/2002 | Brown | |
| 6,522,580 B2 | 2/2003 | Chen et al. | |
| 6,603,692 B2 | 8/2003 | Hirota | |
| 6,859,397 B2 | 2/2005 | Lutze et al. | |
| 6,882,592 B2 | 4/2005 | Noguchi et al. | |
| 6,917,542 B2 | 7/2005 | Chen et al. | |
| 7,042,795 B2 | 5/2006 | Lee et al. | |
| 7,064,981 B2 | 6/2006 | Roohparvar | |
| 7,158,442 B1 | 1/2007 | Beh et al. | |
| 7,180,787 B2 * | 2/2007 | Hosono et al. ........... 365/185.17 |

(Continued)

OTHER PUBLICATIONS

International Search Report and Written Opinion of the International Searching Authority dated Aug. 28, 2009, PCT Patent Appl. No. PCT/IL2009/000514.

(Continued)

*Primary Examiner* — Trong Phan
(74) *Attorney, Agent, or Firm* — Vierra Magen Marcus & DeNiro LLP

(57) ABSTRACT

Read throughput is increased in a non-volatile memory device by sensing storage elements which are of interest as soon as a word line voltage has propagated to them, but before the word line voltage has propagated to other storage elements which are not of interest. The delay which would be incurred by waiting for the voltage to propagate along the entire word line is avoided. The sensing can occur during programming, as a verify operation, or after programming, as where user data is read. Further, the storage elements may be sensed concurrently, e.g., via sense amplifiers. Data from the storage elements of interest is processed and data from the other storage elements is discarded. A time for sensing the storage elements of interest can be set by identifying which storage elements are being verified or include data which is requested by a read command.

19 Claims, 10 Drawing Sheets

U.S. PATENT DOCUMENTS

| | | | |
|---|---|---|---|
| 7,237,074 B2 | 6/2007 | Guterman et al. | |
| 7,251,160 B2 | 7/2007 | Li | |
| 7,295,472 B2 * | 11/2007 | Pascucci et al. | 365/185.17 |
| 7,397,700 B2 * | 7/2008 | Pascucci et al. | 365/185.18 |
| 7,606,071 B2 * | 10/2009 | Sekar et al. | 365/185.17 |
| 7,606,079 B2 * | 10/2009 | Sekar et al. | 365/185.22 |
| 7,613,045 B2 * | 11/2009 | Murin et al. | 365/185.2 |
| 7,616,506 B2 * | 11/2009 | Mui et al. | 365/185.17 |
| 7,623,387 B2 * | 11/2009 | Dong et al. | 365/185.18 |
| 7,649,778 B2 * | 1/2010 | Pascucci et al. | 365/185.17 |
| 7,684,243 B2 * | 3/2010 | Aritome et al. | 365/185.17 |
| 7,696,035 B2 * | 4/2010 | Mokhlesi | 365/185.17 |
| 7,705,387 B2 * | 4/2010 | Ito | 365/185.11 |
| 2005/0213385 A1 | 9/2005 | Hosono | |
| 2006/0023497 A1 | 2/2006 | Kawazoe | |
| 2007/0097759 A1 | 5/2007 | Chen | |
| 2007/0133285 A1 | 6/2007 | Lee | |
| 2007/0211537 A1 | 9/2007 | Park | |

OTHER PUBLICATIONS

International Preliminary Report on Patentability dated Nov. 30, 2010, International Application No. PCT/IL2009/000514 filed May 24, 2009.

Response to Written Opinion dated Feb. 11, 2011, European Patent Application No. 09754332.6 filed May 24, 2009.

* cited by examiner

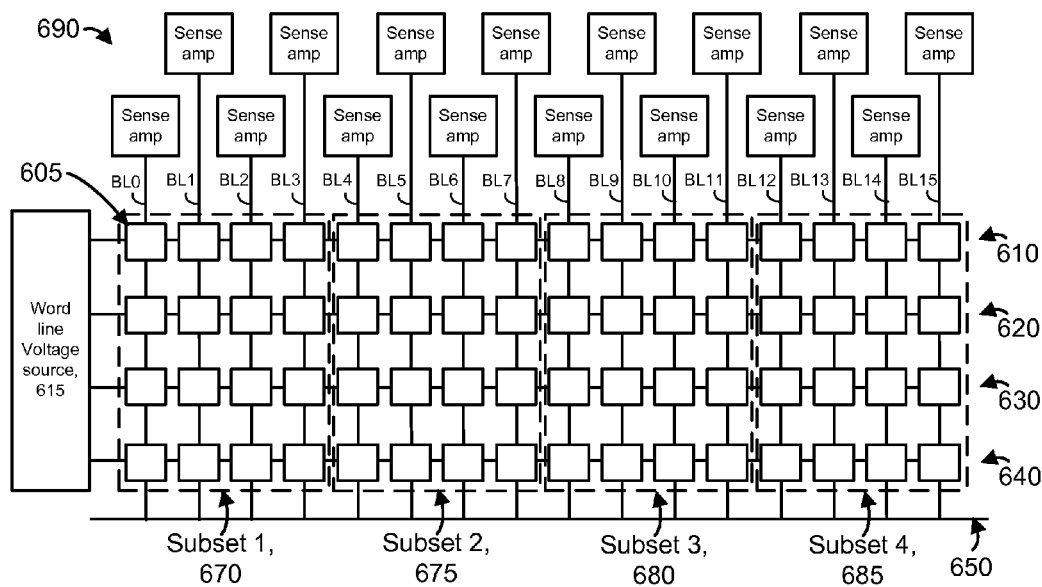
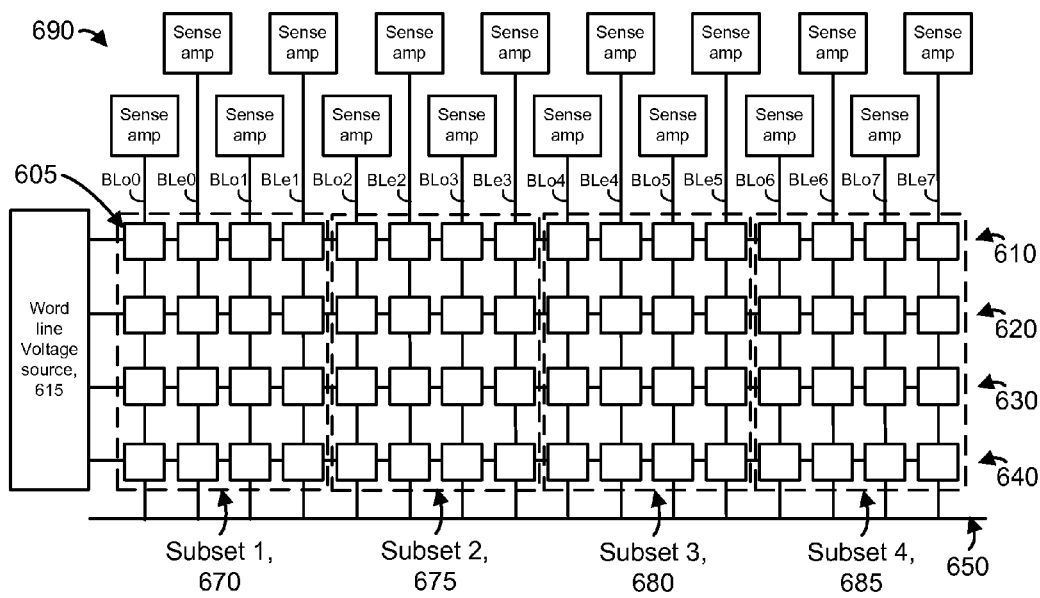

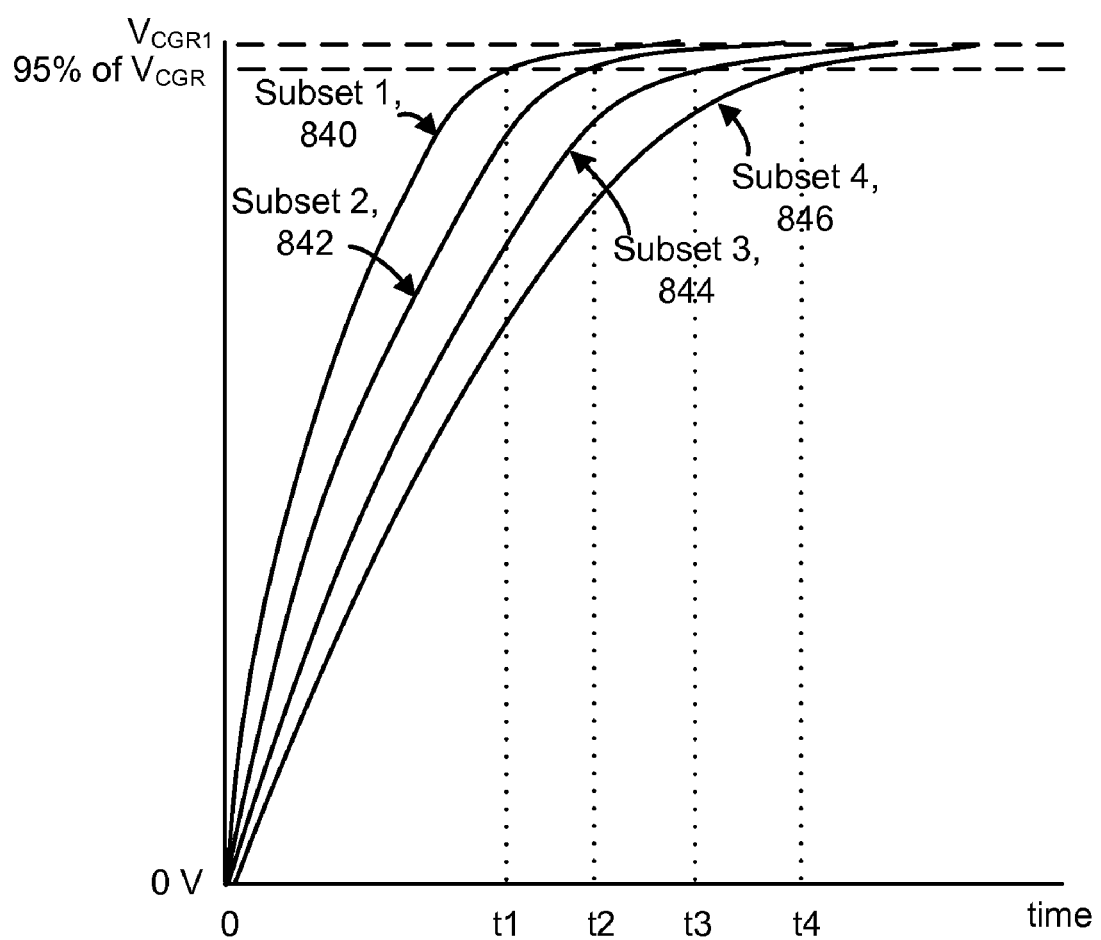

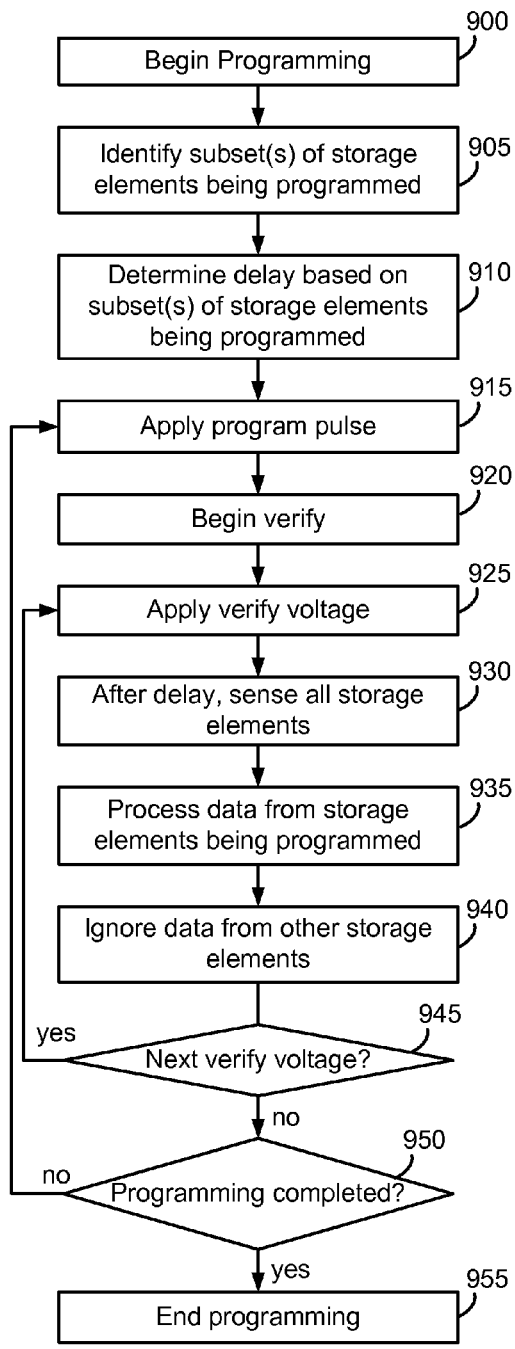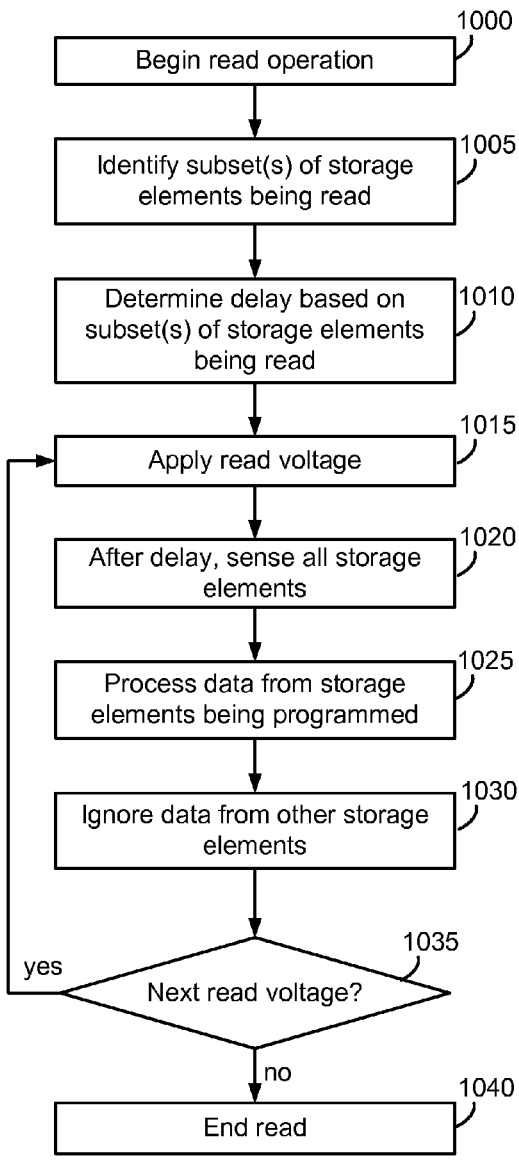

INCREASING READ THROUGHPUT IN NON-VOLATILE MEMORY

BACKGROUND OF THE INVENTION

1. Field of the Invention

The present invention relates to a memory device.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In practice, the program voltage is applied to a word line which is in communication with the control gates of a number of storage elements. In fact, the control gates may be formed from portions of the word lines. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points. The verification involves applying a series of verify voltages to the word line which is in communication with the storage elements which are being read, and sensing, for each verify voltage, whether the storage elements are conductive, via associated bit lines and sense amplifiers.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. Nos. 6,859,397 and 6,917,542, both of which are incorporated herein by reference in their entirety.

Further, during a read operation which occurs after programming, a series of read reference voltages are applied to a set of storage elements to be read, and a determination is made as to which read reference voltage causes a storage element to become conductive. The read reference voltages are set to allow different data states of the storage elements to be distinguished. For example, if there are n possible data states used, it is typically necessary to apply n–1 read voltage levels sequentially to a storage element to ascertain the state of the storage element. The verification, which occurs as part of the programming process, and the reading, which occurs after programming, can both be considered to be read operations.

However, such read operations typically require a delay which is set based on the propagation time of the verify or read voltage along the entire word line. As a result, throughput is not always optimized.

SUMMARY OF THE INVENTION

The present invention provides a method for optimizing throughput during read operations in a non-volatile storage system.

In one embodiment, a method for operating non-volatile storage includes applying a control gate voltage to one end of a selected word line, where the selected word line is in communication with a set of non-volatile storage elements along the selected word line. The method further includes sensing a first subset of non-volatile storage elements in the set after the control gate voltage has reached all of the non-volatile storage elements in the first subset, and sensing a second subset of non-volatile storage elements in the set before the control gate voltage has reached all of the non-volatile storage elements in the second subset.

In another embodiment, a method for operating non-volatile storage includes applying a voltage to one end of a selected word line, where the selected word line is in communication with a set of non-volatile storage elements along the selected word line, and the voltage propagates to the non-volatile storage elements. The method further includes concurrently sensing: (a) at least a first non-volatile storage element in the set which is ready to be sensed based on a propagation time of the voltage from the end of the word line to the at least a first non-volatile storage element, and (b) at least a second non-volatile storage element in the set which is not ready to be sensed based on a propagation time of the voltage from the end of the word line to the at least a second non-volatile storage element. Further, data obtained from the sensing at least a first non-volatile storage element is processed, and data obtained from the sensing at least a second non-volatile storage element is ignored.

In another embodiment, a storage system includes a set of non-volatile storage elements, a word line in communication with the set of non-volatile storage elements, and at least one control circuit. The at least one control circuit: applies a control gate voltage to one end of the selected word line, senses a first subset of the non-volatile storage elements in the set after the control gate voltage has reached all of the non-volatile storage elements in the first subset, and senses a second subset of non-volatile storage elements in the set before the control gate voltage has reached all of the non-volatile storage elements in the second subset.

In another embodiment, a method for operating non-volatile storage includes receiving a read command and identifying a first subset of a set of non-volatile storage elements as including data which is requested by the read command, where the set of non-volatile storage elements is in communication with a selected word line. The method further includes determining a designated time for sensing of the first subset based on the identifying, applying a control gate voltage to one end of the selected word line, sensing the first subset of the non-volatile storage elements at the designated time, and sensing a second subset of the set of non-volatile storage elements at the designated time. At the designated time, the control gate voltage has reached all of the non-volatile storage elements in the first subset but has not reached all of the non-volatile storage elements in the second subset.

Corresponding methods, systems and computer- or processor-readable storage devices for performing the methods provided herein may be provided.

BRIEF DESCRIPTION OF THE DRAWINGS

FIG. 6 depicts a set of storage elements arranged in multiple subsets, with an all bit line configuration.

FIG. 7 depicts a set of storage elements arranged in multiple subsets, with an odd-even bit line configuration.

FIG. 8c depicts word line voltage vs. time for one read voltage, at different locations along a word line.

FIG. 9 depicts a programming method.

FIG. 10 depicts a reading method.

DETAILED DESCRIPTION

The present invention provides a method and apparatus for optimizing throughput during read operations in a non-volatile storage system.

Figure 1:
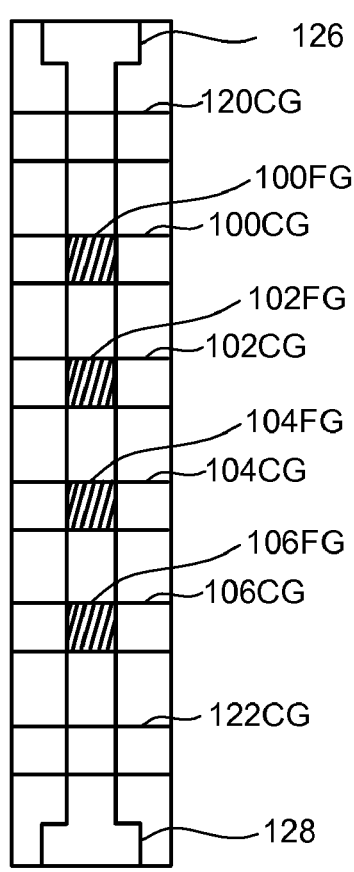
FIG. 1 is a top view of a NAND string.
Figure 2:
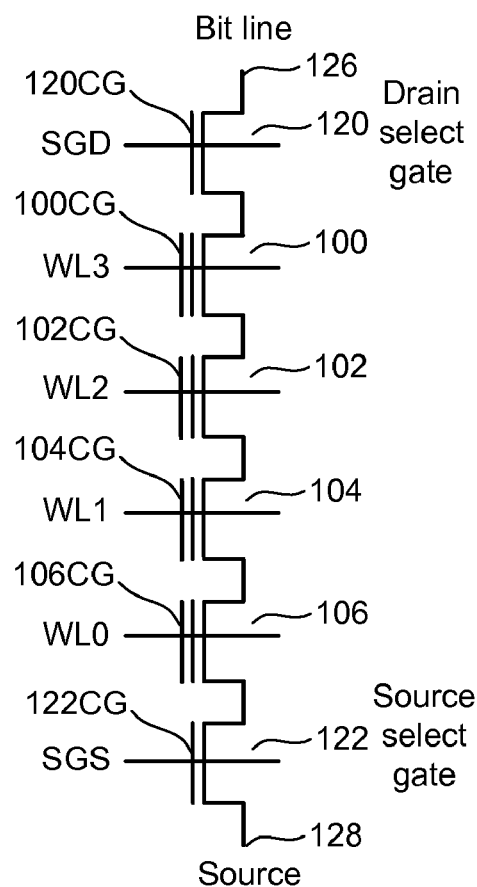
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
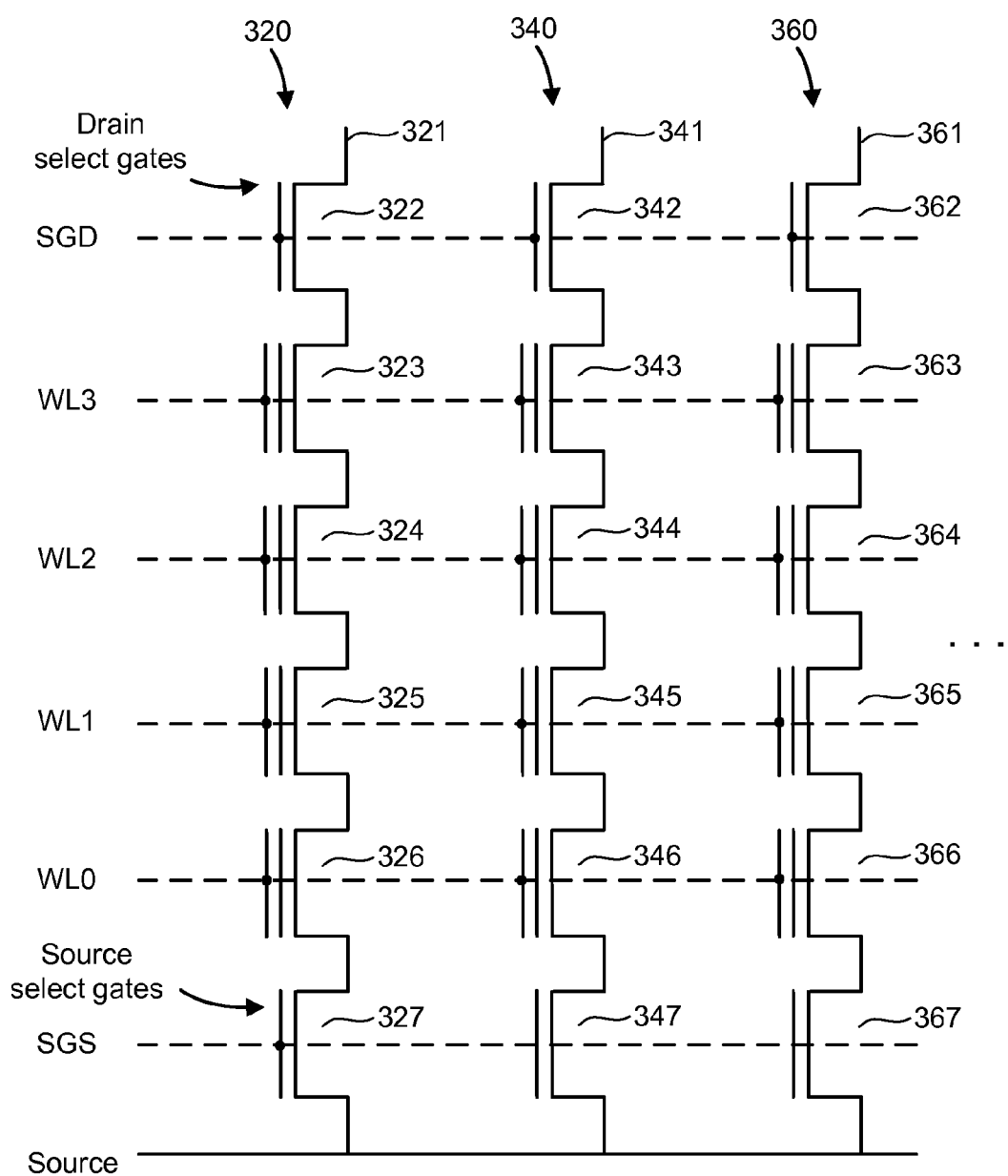
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422, 5,570, 315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364. The unselected storage elements 344 and 364 are subject to program disturb. Program disturb occurs when an unselected storage element on the same word line as a selected storage element is inadvertently programmed due to application of a relatively high program voltage on the selected word line.

Figure 4:
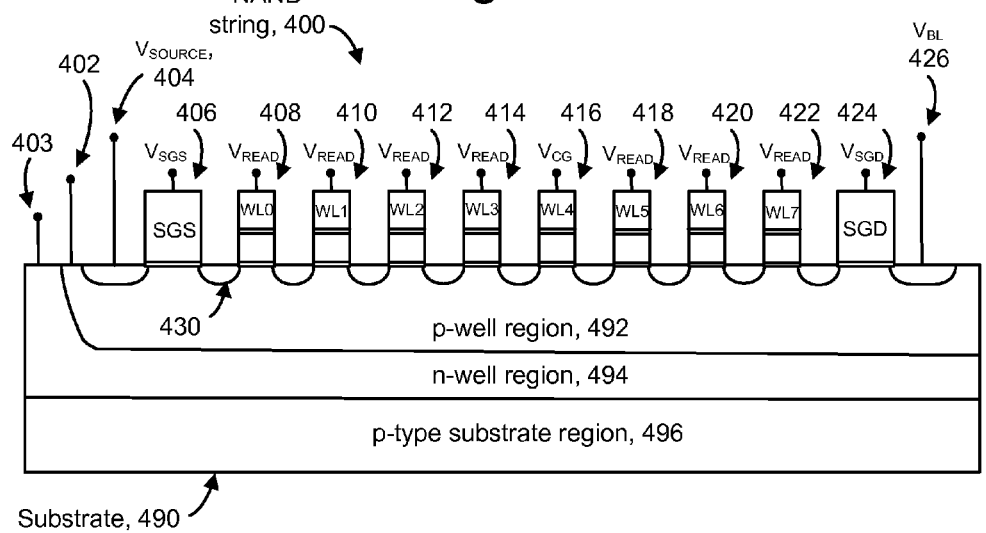
FIG. 4 depicts a cross-sectional view of a NAND string formed on a substrate.

FIG. 4 depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line VBL 426 with a potential of $V_{BL}$. Voltages can also be applied to the p-well region 492 via a terminal 402 and to the n-well region 494 via a terminal 403.

During a read operation, a control gate voltage $V_{CG}$ is provided on a selected word line, in this example, WL3, which is associated with storage element 414 and other storage elements which are not shown. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, $V_{READ}$ is applied to the remaining word lines associated with NAND string 400, in one possible scheme. $V_{SGS}$ and $V_{SGD}$ are applied to the select gates 406 and 424, respectively.

Figure 5:
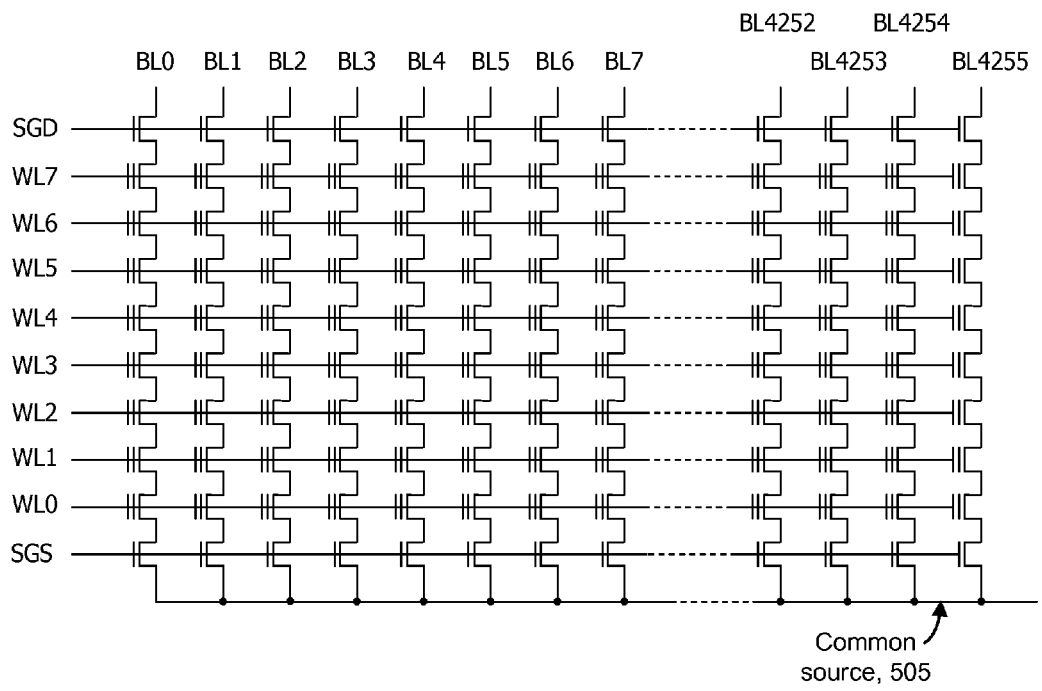
FIG. 5 depicts a block of storage elements.

FIG. 5 depicts a block of storage elements. In one example implementation, a NAND flash EEPROM can be partitioned into 1,024 blocks. The data stored in each block can be simultaneously erased. In one embodiment, the block is the minimum unit of storage elements that are simultaneously erased. In each block, in this example, there are 4,256 columns corresponding to bit lines BL0, BL1, . . . BL4255. In one embodiment referred to as an all bit line (ABL) architecture, all the bit lines of a block can be simultaneously selected during read and program operations, and storage elements along a common word line and connected to any bit line can be programmed at the same time.

In the example provided, eight storage elements are connected in series to form a NAND string, and there are eight data word lines WL0 through WL7. A NAND string can also include dummy storage elements and associated word lines. In other embodiments, the NAND strings can have more or less than eight data storage elements. Data memory cells can store user or system data. Dummy memory cells are typically not used to store user or system data.

One terminal of each NAND string is connected to a corresponding bit line via a drain select gate (connected to select gate drain line SGD), and another terminal is connected to a common source 505 via a source select gate (connected to select gate source line SGS). Thus, the common source 505 is coupled to each NAND string.

In one embodiment, referred to as an odd-even architecture, the bit lines are divided into even bit lines (BLe) and odd bit lines (BLo). In this case, storage elements along a common word line and connected to the odd bit lines are programmed at one time, while storage elements along a common word line and connected to even bit lines are programmed at another time. In each block, the columns are divided into even columns and odd columns.

During one configuration of read and programming operations, 4,256 storage elements are simultaneously selected. The storage elements selected have the same word line and are thus part of a common physical page. Therefore, 532 bytes of data, which also form a logical page, can be read or programmed simultaneously, and one block of the memory can store at least eight logical pages. In this example, a physical page and a logical page are the same but, in general, this is not required. For example, a physical page can include multiple logical pages. A logical page is typically the smallest set of storage elements that are written (programmed) simultaneously. For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines are raised to a read pass voltage, $V_{READ}$, (typically a voltage in the range of 4.5 to 6 V) to make the transistors operate as pass gates. The selected word line is connected to a voltage, a level of which is specified for each read and verify operation, to determine whether a $V_{TH}$ of the concerned storage element is above or below such level. For example, in a read operation for a two-level storage element, the selected word line may be grounded, so that it is detected whether the $V_{TH}$ is higher than 0 V. In a verify operation for a two level storage element, the selected word line is connected to 0.8 V, for example, so that it is verified whether or not the $V_{TH}$ has reached at least 0.8 V. The source and p-well are at 0 V. The selected bit lines are pre-charged to a level of, for example, 0.7 V. If the $V_{TH}$ is higher than the read or verify level on the word line, the potential level of the bit line associated with the storage element of interest maintains the high level because of the non-conductive storage element. On the other hand, if the $V_{TH}$ is lower than the read or verify level, the potential level of the concerned bit line decreases to a low level, for example, less than 0.5 V, because the conductive storage element discharges the bit line. The state of the storage element can thereby be detected by a voltage comparator sense amplifier that is connected to the bit line, in one possible implementation. As with programming, read operations can be performed on a per-page basis.

Many details of erase, read and verify operations described above are performed according to techniques known in the art. Thus, many of the details explained can be varied by one skilled in the art. Other erase, read and verify techniques known in the art can also be used.

FIG. 6 depicts a set of storage elements arranged in multiple subsets, with an all bit line configuration. An all bit line configuration generally involves storing data of a page in adjacent storage elements. The set of storage elements, including example storage element 605, include a number of rows of storage elements which are arranged along associated word lines, such as word lines 610, 620, 630 and 640. A word line voltage source 615 provides voltages to the word lines during programming and read operations. Typically, one word line is a selected word line which includes one or more storage elements that have been selected for programming or reading. The storage elements are associated with bit lines which are labeled BL0 through BL15, in this example. The storage elements may be arranged in NAND strings. Further, a sense amp is associated with each bit line for sensing whether a selected storage element is conductive. A controller within the memory device accesses the sense amp to determine whether a selected storage element is conductive and stores corresponding data in a buffer which indicates the state of a storage element. For a read operation, the controller informs an external host that it can read the data from the buffer by setting a READY/BUSY signal to READY. For a program-verify operation, the controller uses the data internally to determine that the selected storage element has been programmed to its intended state. The sense amps are shown generally at 690. A common source line 650 is also provided.

When a voltage is applied to a selected word line at one end of the word line by the word line voltage source 615, the voltage propagates along the word line to the other end in a finite propagation time. In particular, in modern memory devices such as NAND flash memory devices, as the page becomes longer, and the RC time constant of the word line increases, the read operation timing increases as well. For example, thousands of storage elements may be associated with a common word line, in which case the propagation delay can be significant. The example of FIG. 6 provides sixteen storage elements per word line as a simplified illustration. Thus, a longer time is needed for settling of the word line voltage before a sensing operation may start, resulting in relatively longer read times. It would be advantageous to find a way to decrease page read times.

Specifically, the word line voltage is applied to a word line at one physical end of the word line, e.g., a near end, (such as at the left hand side of one of the word lines of FIG. 6), so that the voltage will settle at a steady level sooner at a part of the word line which is closer to the near end than to the other end, e.g., the far end (such as at the right hand side of one of the word lines of FIG. 6). Note that voltages are typically applied to the unselected word lines as well, although generally at a different level than the selected word line. Generally, the voltage will settle at progressively increasing times at progressively increasing distances from the near end of the word line. Note that in other configurations, the word line voltages are applied at different ends of the word lines, e.g., the voltages may be applied at the left hand side of the odd numbered word lines, and at the right hand side of the even numbered word lines. The principles discussed regarding propagation time are the same regardless of which end of the word line receives the applied voltage.

As a result, sensing of the storage elements which are closer to the near end of the word line may be started earlier than sensing of the storage elements which are closer to the far end of the word line, without waiting for the voltage along the entire word line to be settled. Since the duration of a sense operation is constant, this means that the data of the near storage elements may be ready for shifting out of the memory, from the buffer to the host, earlier than data of the far storage elements. In this approach, overall read operation time, comprising read time and shift out time, may be shortened. Further, in some cases, it is desired to read data from only a portion of the storage elements associated with a word line. In this case, all storage elements of the word line may be read concurrently before the word line voltage has settled throughout the word line, as long as it has settled for the storage elements which are desired to be read. This approach may essentially result in reading useless data from the storage elements for which the word line voltage has not yet settled. These storage elements cannot be read correctly because the word line voltage is not at an accurately known level. This data can be ignored/discarded since it is not useful. No harm results from reading of such useless data. In fact, advantages may be achieved by such sensing and ignoring of useless data as it avoids the need for the memory to have the capability to activate only specific sense amplifiers or other sense components.

Various implementations are possible. In one possible approach, the sets of storage elements, which stores one or more pages of data, can be divided into multiple subsets. For example, FIG. 6 provides four subsets, namely subset 1 (670), subset 2 (675), subset 3 (680) and subset 4 (685). In this case, each subset has four storage elements per word line. However, subsets of different sizes may be used as well. For example, the subset size may be generally progressively smaller or larger as a function of the distance from the near end of the word line. An example of a progressively smaller subset size is: subsets 1, 2, 3 and 4 having eight, four, two and two storage elements, respectively. Thus, the subset size decreases monotonically as distance from the near end increases. An example of a progressively larger subset size is: subsets 1, 2, 3 and 4 having two, two, four and eight storage elements, respectively. Thus, the subset size increases monotonically as distance from the near end increases. Other approaches may use different subset sizes in a symmetric pattern, such as subsets 1, 2, 3 and 4 having two, six, six and two storage elements, respectively. Various other approaches are possible as well. Generally, the subset sizes can be uniform or varied.

Further, the subset size can correspond with a page size, or can be smaller or larger than a page. A page is the smallest unit of data which is written as a unit by a host device. Thus, a subset can include a number of storage elements which store bits of an entire page of data, or bits of more or less than an entire page of data.

By dividing the storage elements into subsets, a timing scheme can be generated which will start sensing operations of the appropriate subset as early as the word line voltage has been settled for that subset. For example, in FIG. 6, subset 1 can be sensed as soon as the word line voltage has propagated to all of the storage elements in the subset. The word line voltage is considered to propagate to a location along the word line when it has reached within a tolerance of a steady state level at the location, in one approach. Similarly, subset 2 can be sensed as soon as the word line voltage has propagated to all of the storage elements in that subset, and so forth.

FIG. 7 depicts a set of storage elements arranged in multiple subsets, with an odd-even bit line configuration. An odd-even bit line configuration generally involves storing different pages of data in odd and even numbered bit lines, e.g., one page on the odd numbered bit lines and another page on the even numbered bit lines. This architecture eliminates or reduces certain cross-coupling interferences between adjacent storage elements. The storage elements are associated with odd numbered bit lines which are labeled BLo0 through BLo7, and with even numbered bit lines which are labeled BLe0 through BLe7. Here, the arrangement of subsets is the same as in FIG. 6, in an example implementation. However, only alternate bit lines are involved in programming/verifying or reading.

Figure 8A:
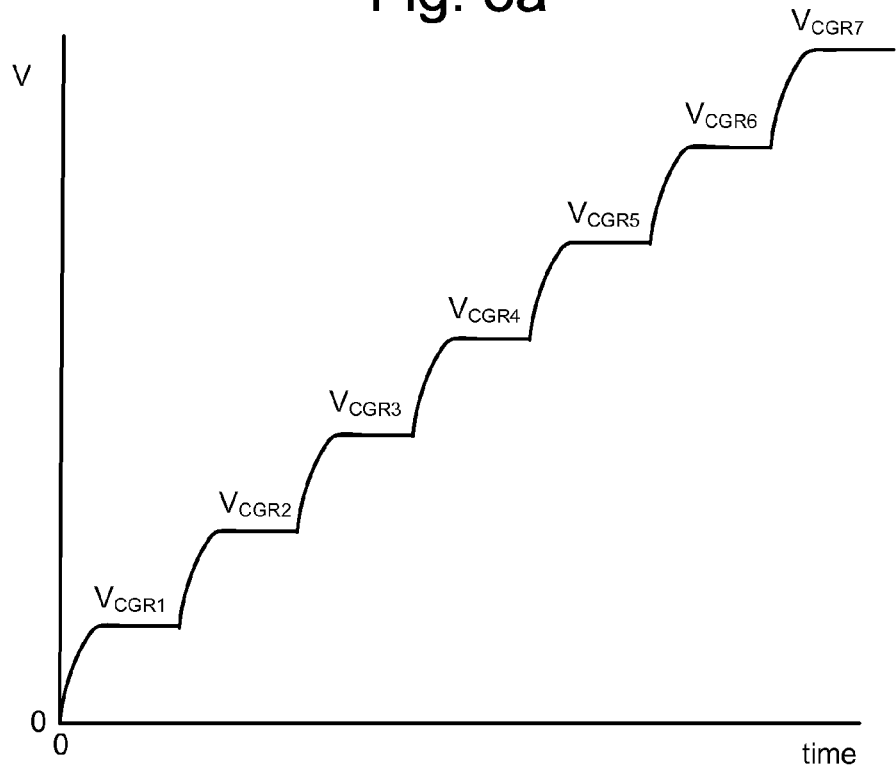
FIG. 8a depicts word line voltage vs. time for different read voltages.

FIG. 8a depicts word line voltage vs. time for different read voltages. Reading a storage element involves determining which data state is represented by the threshold voltage distribution of the storage element. When there are n possible data states in use, n-1 read levels are used: VCGR1, VCGR2, VCGR3, VCGR4, VCGR5, VCGR6 and VCGR7. The present example assumes eight data states, although fewer or more states can be used. Each read level is applied in succession to the selected word line and one or more selected storage elements are sensed to determine whether they are conductive. If an element is conductive, this means the word line voltage exceeds the threshold voltage. If an element is not conductive, this means the word line voltage is less than the threshold voltage. If only one storage element is being read, it is possible to ascertain its state without necessarily applying all read voltages. However, typically when multiple storage elements of a common word line are read concurrently, all read voltages are used.

Further, the storage elements are sensed at each read level when the read voltage has reached a steady condition so that its amplitude is accurately known. FIG. 8 depicts the read voltage at a fixed location along the word line. It indicates how the read voltage rises and levels out at each read level, then subsequently rises again to the next read level, until all read levels have been traversed. A similar voltage vs. time relationship can be provided for different locations along a word line. As mentioned, the time needed to reach a steady value will increase at further distances from the near end of the word line, where the voltage is applied.

Figure 8B:
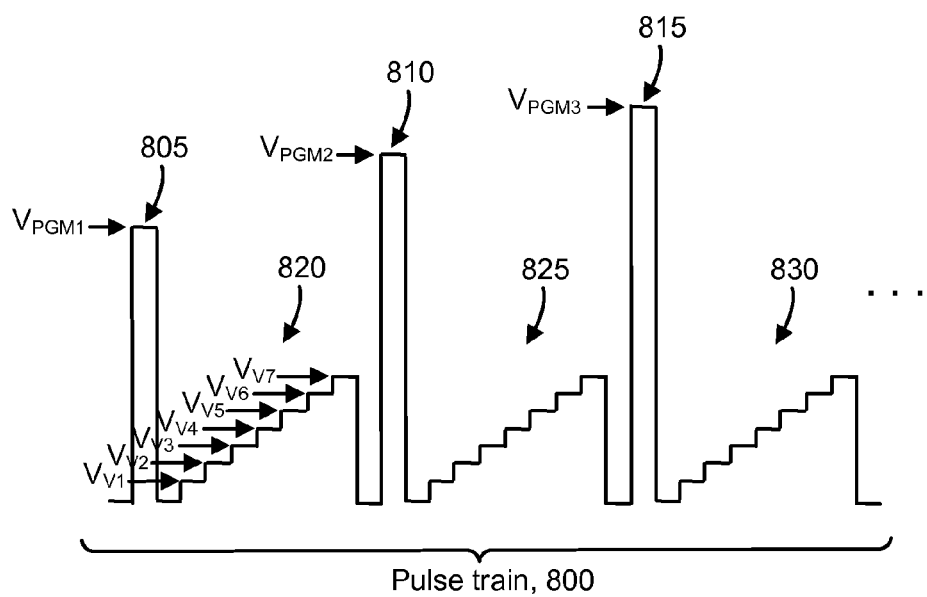
FIG. 8b depicts a pulse train used during programming.

FIG. 8b depicts a pulse train used during programming. Verify operations, which are a form of read operations, typically occur between program pulses. For example, during programming, a pulse train 800 may be applied to a selected word line which include successively increasing program voltages $V_{PGM1}$ (805), $V_{PGM2}$ (810), $V_{PGM3}$ (815), and so forth. Between adjacent program pulses are sets of verify voltages 820, 825, 830, . . . , similar to the read voltages of FIG. 8a, although differing in amplitude. Each set of verify voltages can include up to n-1 verify voltages when there are n data states. In some cases, fewer than n-1 verify voltages are used. For instance, early in the pulse train, only lower states may be verified as the higher states are not expected to be reached yet. Moreover, if only one storage element is being programmed, it is possible to ascertain whether it has reached a target data state without necessarily applying all verify voltages. However, typically when multiple storage elements of a common word line are programmed concurrently, all verify voltages are used.

FIG. 8c depicts word line voltage vs. time for one read voltage, at different locations along a word line. Time=0 denotes when a voltage is initially applied at the near end of a word line. $V_{CGR1}$ is an example steady state control gate read voltage, and is the lowest read voltage. Curves 840, 842, 844 and 846 depict the voltages for subset 1 (670), subset 2 (675), subset 3 (680) and subset 4 (685) (see also FIGS. 6 and 7). The location of the voltage for each subset may be at the storage element which is furthest from the near end of the word line, where the word line voltage is applied. Thus, for example, curve 840 represents the voltage at the storage element associated with BL3 in FIG. 6 or bit line BLe1 in FIG. 7, curve 842 represents the voltage at the storage element associated with BL7 in FIG. 6 or bit line BLe3 in FIG. 7, curve 844 represents the voltage at the storage element associated with BL11 in FIG. 6 or bit line BLe5 in FIG. 7, and curve 846 represents the voltage at the storage element associated with BL15 in FIG. 6 or bit line BLe7 in FIG. 7.

As can be seen, the voltage takes longer to reach a steady value, in this case $V_{CGR1}$, or to reach within some threshold of the steady state value, such as 95% of VCGR1, or 0.1 V below $V_{CGR1}$, for the subsets which are further from the near end of the word line. For example, the voltage for subsets 1, 2, 3 and 4 reach 95% of $V_{CGR1}$, at times t1, t2, t3 and t4, respectively.

A similar word line voltage vs. time relationship may be seen for each subsequent voltage increase on the word line. For example, after sensing is performed at $V_{CGR1}$, the word line voltage will be raised to the next read level, $V_{CGR2}$. Generally, if the step size between the word line voltages is equal, the time for the voltage to reach the next steady value will be the same or nearly the same, for a given location on the word line. If the step size between the voltages is not equal, the time for the voltage to reach the next steady state value will increase for larger steps and will decrease for smaller steps. Note that the data of FIG. 8c can be obtained by testing of a memory device and/or by theoretical calculations which account for the RC time constant of a word line. In one approach, the time values t1, t2, t3 and t4 are delays which are obtained and stored in the logic of the memory device to determine when to begin sensing of one or more storage elements.

As mentioned, analogous data may be obtained for the verify operations. In fact, if the step size is the same for the verify levels as for the read levels, the same delays may be used.

Note also that the number of subsets which is used impacts the amount of overhead data which is needed. For instance, it is possible to have a separate delay for each storage element on a word line, e.g., to have a subset size of one storage element, but this would result in the need to store additional overhead data.

In the example provided, a word line is divided into four equal groups or subsets of storage elements. If the total number of storage elements on a word line is N, then the first subset includes storage elements 1 through N/4, the second subset include storage elements ¼ N+1 through ½ N, the third subset include storage elements ½N+1 through ¾N, and the fourth subset include storage elements ¾N through N. FIG. 8c schematically represents the variation of the word line voltage at the end of each such subset, e.g., at the storage elements N/4, N/2, ¾N and N, with the time from application of a voltage to the near end of the word line.

In the sensing process, data from the sense amps is stored in a buffer of the memory device and subsequently shifted out from the buffer to the host. For example, see buffer 1220 in FIG. 12 or buffer 1352 in FIG. 13. Assume that in order to start sensing, the word line voltage has to reach a certain level which is close to the steady state level, such as some delta voltage, e.g., 0.1 V, below the steady state level, or some percentage of the step size between the steady state levels, e.g., 95%. The sensing of the first subset may start relatively early, at t1. If we assume that the sense operation and other operations to make storage element data available to the host consume a time "T", then the first, second, third and fourth subset of storage elements may be available for shifting out at time t1+T, t2+T, t3+T and t4+T, respectively.

Without implementation of the above method, the sensing may be started only after the voltage of the entire word line has been settled, e.g., after t4, in which case the first storage element data is not available for shifting out until after t4+T. Thus, the suggested technique of dividing a page or other set of storage elements into subsets and implementing optimal sense start times for each subset results in faster availability of the data at the memory device output, and, therefore, in reduced read time and improved throughput.

There is yet another case in which using the described technique for setting timing of sensing may be beneficial. In some applications, when the goal of the reading operation is not necessarily to obtain an entire page of data, but instead involves, e.g., evaluating certain statistical characteristics, only a partial amount of a page may be need which is sufficient for such a statistical evaluation. In such cases, data sensing may be started at the time when the word line voltage has been settled at the page portion, sufficient for the application analysis, and data shifting, e.g., from a buffer internal to the memory device to an external host, may start immediately after the sensing. In this way, the reading operation may be significantly shortened.

In yet another approach, when a set of storage elements is being verified or read, the storage element which belongs to the subset having the largest delay is identified, and this delay prevails as the delay which is used in concurrently sensing the storage elements of interest. In many cases, the delay is less than the highest possible delay, if the storage elements of interest are contained in the lower subsets. As a result, time savings/throughput improvements can be realized. For example, if the storage elements of interest are contained in subsets 1-3 but not in subset 4, the delay is t3. In contrast, the full delay of t4 would be necessary in conventional approaches. A time savings of t4−t3 is thus realized.

Further, in some approaches, only the sense amps for a particular subset which is being sensed are activated at a given time. For example, when subset 1 is being sensed, only the sense amps for subset 1 are activated, when subset 2 is being sensed, only the sense amps for subset 2 are activated, and so forth. However, it is also possible to activate all of the sense amps, or some subset of the sense amps, and to ignore the data from some of the sense amps. For example, when subset 1 is being sensed, the sense amps for all subsets 1-4 may be activated, but the control logic can be configured to ignore/discard the data from the sense amps of subsets 2-4. Similarly, when subset 2 is being sensed, the control logic can be configured to ignore/discard the data from the sense amps of subsets 1, 3 and 4, when subset 3 is being sensed, the data from the sense amps of subsets 1, 2 and 4 can be ignored, and when subset 4 is being sensed, the data from the sense amps of subsets 1-3 can be ignored.

This approach is particularly advantageous as it does not require changing when the sense amps perform sensing, or providing the capability to control the sense amps individually or in groups. The existing design of a memory device can be used in which the device performs sensing without regard to propagation time. For example, a memory device may be configured to perform sensing concurrently for all bit lines, all odd bit lines or all even bit lines. In such cases, the control logic can be configured to perform the sensing early, before the word line voltage propagates throughout the word line, as long as the word line voltage has at least propagated to the storage elements of interest, e.g., those which are being verified or read. The control logic can also be configured to ignore the sensed data from the storage elements which are not of interest, as discussed.

In some cases, the sense amps are multiplexed by the bit lines so that only a portion of the bit lines are sensed at a time. For example, a memory device may be configured to perform sensing separately for first and second halves of all bit lines, all odd bit lines or all even bit lines. In such cases, analogous principles are applied. For example, assume the first half of the bit lines in FIG. 6, e.g., BL0 through BL7 (encompassing subsets 1 and 2) are sensed at one time, in all bit line sensing, and the second half of the bit lines, e.g., BL8 through BL15 (encompassing subsets 3 and 4) are sensed at another time. Also, assume that only storage elements in subset 2 (e.g., BL4-BL7) and subset 3 (e.g., BL8-BL11) are of interest. Thus, when subsets 1 and 2 are sensed, data from sense amps from subset 1 can be ignored and, when subsets 3 and 4 are sensed, data from sense amps from subset 4 can be ignored.

The techniques discussed herein are suitable for use in many cases based on the principle of performing sensing as soon as possible for storage elements of interest, as long as the word line voltage has at least propagated to the storage elements of interest, and ignoring the sensed data from the storage elements which are not of interest, such as when the word line voltage has not fully propagated to the storage elements which are not of interest.

Thus, concurrent sensing can be performed for a first set of non-volatile storage elements which are ready to be sensed based on a propagation time of the voltage from the near end of the word line to the first set, and for a second set of non-volatile storage elements which are not ready to be sensed based on a propagation time of the voltage from the near end of the word line to the second set. Further, the data obtained from sensing the first set can be processed, e.g., provided to a buffer and output to a host device, while the data obtained from sensing the second set can be ignored.

FIG. 9 depicts a programming method. A programming operation begins at step 900. Step 905 includes identifying one or more subsets of storage elements which are being programmed. For example, this may include identifying the subset which includes storage elements which are being programmed, and which is furthest from the near end of the word line at which the word line voltage is applied. As an example, subsets 1, 2 and 3 of FIG. 6 may include storage elements which are being programmed, while subset 4 does not include storage elements which are being programmed. In this case, subsets 1, 2 and 3 are identified, or at least subset 3 is identified as being furthest from the near end of the word line. The control logic may be configured with data in appropriate data structures which relate a storage element or bit line to a subset, in one possible approach. For example, the control logic, such as in the state machine 1312 (FIG. 13) may be configured with a table as follows:

| Storage element/Bit line: | Subset: |
|---|---|
| BL1 | 1 |
| BL2 | 1 |
| BL3 | 1 |
| etc. | 2 |

Or, the address of the storage elements or bit lines which are involved in programming can be related to a particular subset by a mathematical formula.

Step 910 includes determining a delay based on the one or more subsets which are being programmed. In one approach, a separate delay is determined for each subset so that verifying can be initiated at different times for the different subsets based on the respective delay, e.g., at t1, t2 and t3 for subset 1, subset 2 and subset 3, respectively (FIG. 8c). In another approach, the highest delay of all the subsets which are being programmed is determined so that verifying is initiated at that time for each subset, e.g., at t3 for subsets 1, 2 and 3 (FIG. 8c). For example, the control logic, such as in the state machine 1312 (FIG. 13) may be configured with a table as follows:

| Subset: | Delay: |
|---|---|
| 1 | t1 |
| 2 | t2 |
| 3 | t3 |
| 4 | t4 |

It is also possible to associate each storage element/bit line with a delay, as mentioned previously, although this results in additional overhead costs. Note that here we assume that the same delay is used for each verify voltage. It is also possible to have different delays for different verify levels, or groups of verify levels, such as when the step size between the verify voltages is not constant. In this case, the control logic may be configured with a table as follows (where t1-1, t1-2 and t1-3 are different times):

| Subset: | Voltage: | Delay: |
|---|---|---|
| 1 | $V_{V1}$ | t1-1 |
|  | $V_{V2}$ | t1-2 |
|  | $V_{V3}$ | t1-3 |
| 2 | $V_{V1}$ | t2-1 |
| etc. |  |  |

Step 915 includes applying a program pulse, such as pulse 808 (FIG. 8b). Step 920 includes begin the verify process. Step 925 includes applying a verify voltage, such as a voltage at a level of $V_{V1}$ (FIG. 8b). Step 930 includes sensing all storage elements of the selected word line after the determined delay, in one possible approach. For an all bit line configuration, this can include sensing all storage elements of the selected word line, in one example. For an odd-even configuration, this can include sensing all odd or even numbered storage elements of the selected word line, in one example. Step 935 includes processing data from the storage elements being programmed, such as by examining the data to determine whether the storage elements have reached the intended data state. Step 940 includes ignoring data from the other storage elements. At decision step 945, if there is a next verify voltage, it is applied at step 925. Recall from FIG. 8b that a set of verify voltages 820 may be applied after each program pulse. At decision step 945, if there is no next verify voltage, e.g., the last verify voltage $V_{V7}$ has just been applied, decision step 950 is reached, where it is determined if programming is complete. Generally, programming is completed when all storage elements which are being programmed have been verified to have reached their respective target data states, in which case the programming process ends at step 955. If programming is not complete at decision step 950, a next program pulse is applied at step 915, such as pulse 810 in FIG. 8b.

FIG. 10 depicts a reading method. A read operation begins at step 1000. Many of the steps are analogous to those in FIG. 9, as a verify operation is a type of read operation. In both cases, a series of voltages is applied to a selected word line and the storage elements are sensed to determine whether they are conductive. Step 1005 includes identifying one or more subsets of storage elements which are being read. For example, this may include identifying the subset which includes storage elements which are being read, and which is furthest from the near end of the word line at which the word line voltage is applied. As an example, subsets 1, 2 and 3 of FIG. 6 may include storage elements which are being read, while subset 4 does not include storage elements which are being read. In this case, subsets 1, 2 and 3 are identified, or at least subset 3 is identified as being furthest from the near end of the word line. As mentioned, the control logic may be configured with data in appropriate data structures which relates a storage element or bit line to a subset, in one possible approach. The same configuration data may be used in both the verify and read operations.

Step 1010 includes determining a delay based on the one or more subsets which are being read. In one approach, a separate delay is determined for each subset so that reading can be initiated at different times for each subset based on the respective delay. In another approach, the highest delay of all the subsets which are being read is determined so that reading is initiated at that time for each subset. It is also possible to have different delays for different read levels, such as when the step size between the read voltages is not constant.

Step 1015 includes applying a control gate read voltage, $V_{CGR}$, e.g., at one of the levels depicted in FIG. 8a. Step 1020 includes sensing all storage elements of the selected word line after the determined delay, in one possible approach. For an all bit line configuration, this can include sensing all storage elements of the selected word line, in one example. For an odd-even configuration, this can include sensing all odd or even numbered storage elements of the selected word line, in one example. Step 1025 includes processing data from the storage elements being read, such as by shifting their data from a buffer to a host. Step 1030 includes ignoring data from the other storage elements, e.g., not shifting data from the buffer to the host. At decision step 1035, if there is a next read voltage, it is applied at step 1015. Recall from FIG. 8a that a series of read voltages may be applied. At decision step 1035, if there is no next read voltage, e.g., the last read voltage $V_{CGR7}$ has just been applied, the programming process ends at step 1040.

Figure 11:
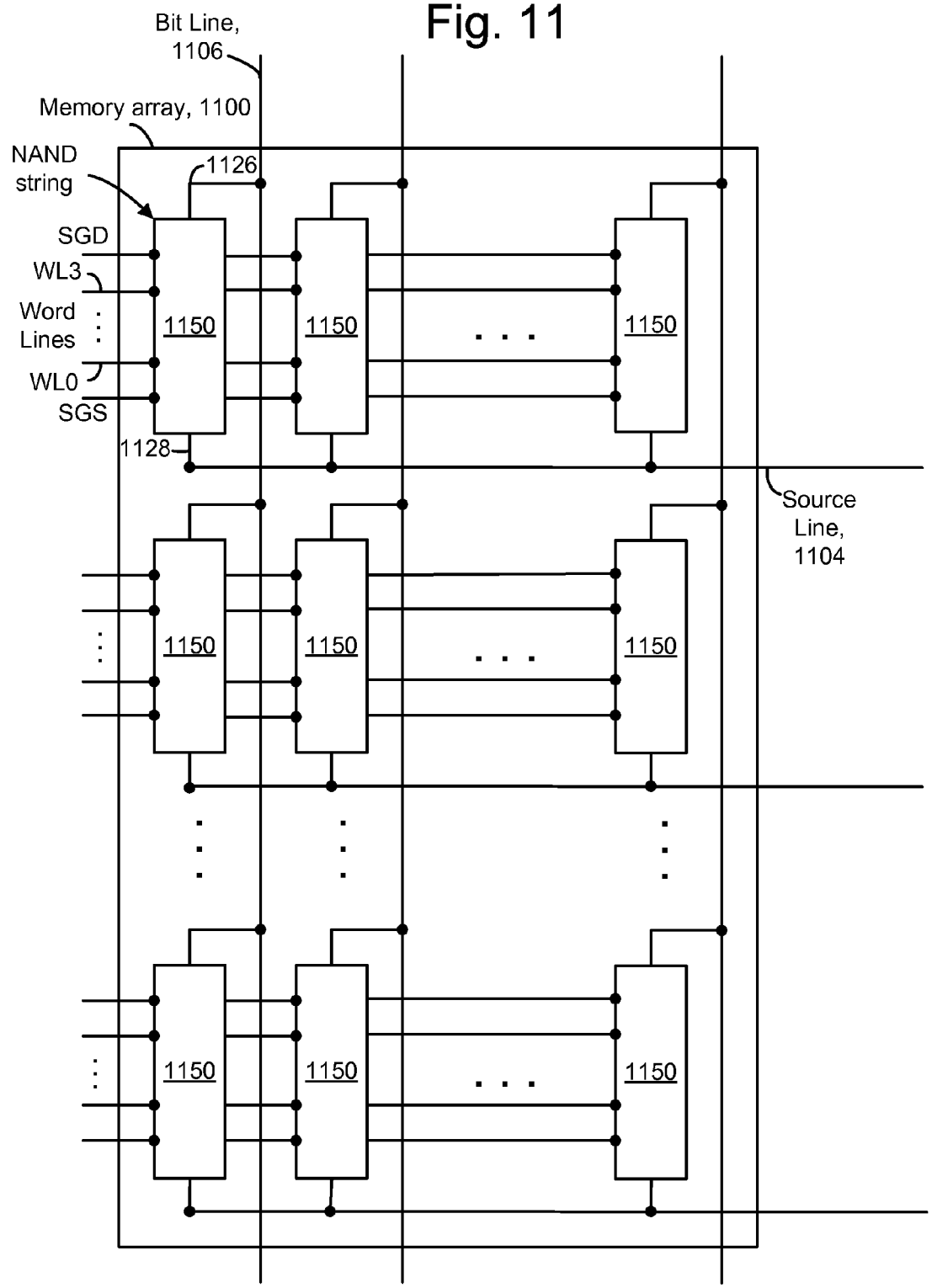
FIG. 11 is a block diagram of an array of NAND flash storage elements.

FIG. 11 is a block diagram of an array of NAND flash storage elements, such as those shown in FIGS. 1 and 2. Along each column, a bit line is coupled to the drain terminal of the drain select gate for the associated NAND string. For example, a bit line 1106 is coupled to the drain terminal 1126 of the drain select gate for the NAND string 1150. Along each row of NAND strings, a source line 1104 may connect all the source terminals 1128 of the source select gates of the NAND strings. An example of a NAND architecture array and its operation as part of a memory system is found in U.S. Pat. Nos. 5,570,315, 5,774,397 and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Figure 12:
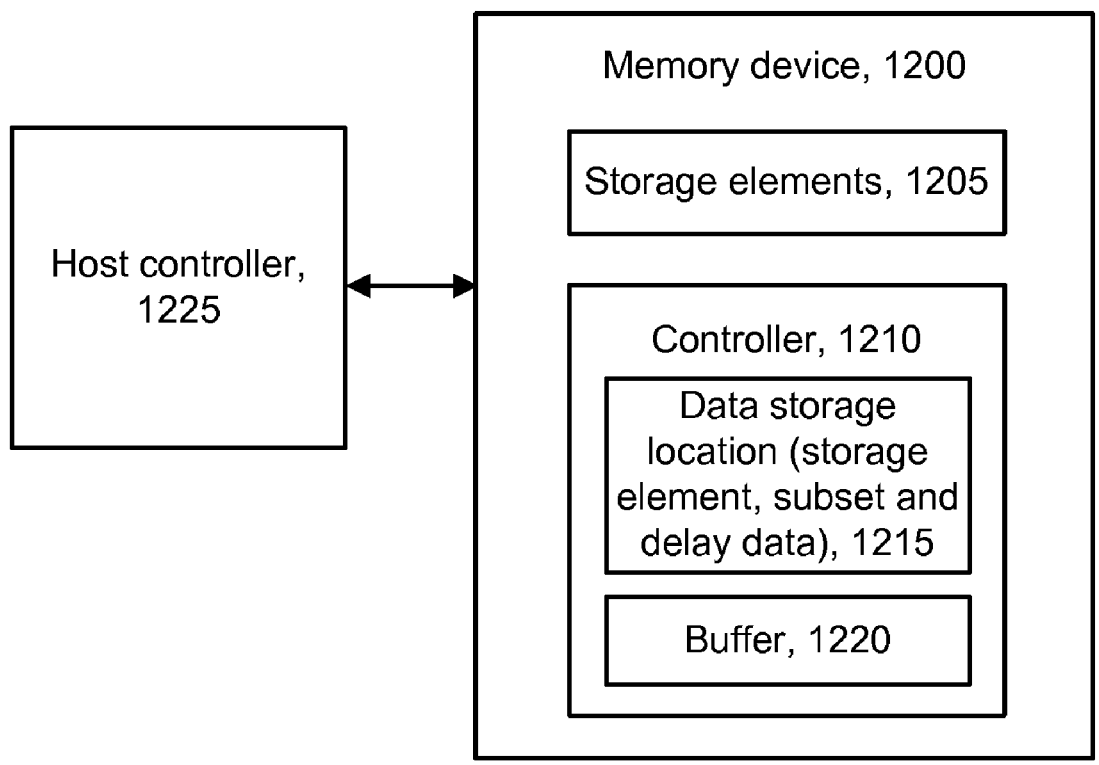
FIG. 12 depicts an overview of a host controller and a memory device.

FIG. 12 depicts an overview of a host controller and a memory device in a storage system. The memory device alone may also be considered to be a storage system. Storage elements 1205 can be provided in a memory device 1200 which has its own controller 1210 for performing operations such as programming/verifying and reading. The memory device may be formed on a removable memory card or USB flash drive, for instance, which is inserted into a host device such as a laptop computer, digital camera, personal digital assistant (PDA), digital audio player or mobile phone. The host device may have its own controller 1220 for interacting with the memory device, such as to read or write user data. For example, when reading data, the host controller can send commands to the memory device indicating an address of user data to be retrieved. The memory device controller converts such commands into command signals that can be interpreted and executed by control circuitry in the memory device. The controller 1210 may also contain a non-volatile data storage location 1215 for storing storage element identifier, subset and delay data, as discussed previously, and a buffer memory 1220 for temporarily storing user data being written to or read from the memory array. The host controller 1225 may be considered to be an entity which is outside of, or external to, the memory device. The memory device may include one or more memory die, for instance, and the host controller may be outside the one or more memory die, discussed in connection with FIG. 13.

The memory device responds to a read command by reading the data from the storage elements and making it available to the host controller. In one possible approach, the memory device stores the read data in the buffer 1220 and informs the host controller of when the data can be read. The host controller responds by reading the data from the buffer and sends another command to the memory device to read data from another address. For example the data may be read page by page. The host controller may process the read data to determine a threshold voltage distribution of the storage elements of the memory device. In another approach, control circuitry of the memory device determines the threshold voltage distribution. Further details of example embodiments of a memory device are provided below.

A typical memory system includes an integrated circuit chip that includes the controller 1210, and one or more integrated circuit chips that each contains a memory array and associated control, input/output and state machine circuits. The memory device may be embedded as part of the host system, or may be included in a memory card that is removably insertable into a mating socket of a host system. Such a card may include the entire memory device, or the controller and memory array, with associated peripheral circuits, may be provided in separate cards.

Figure 13:
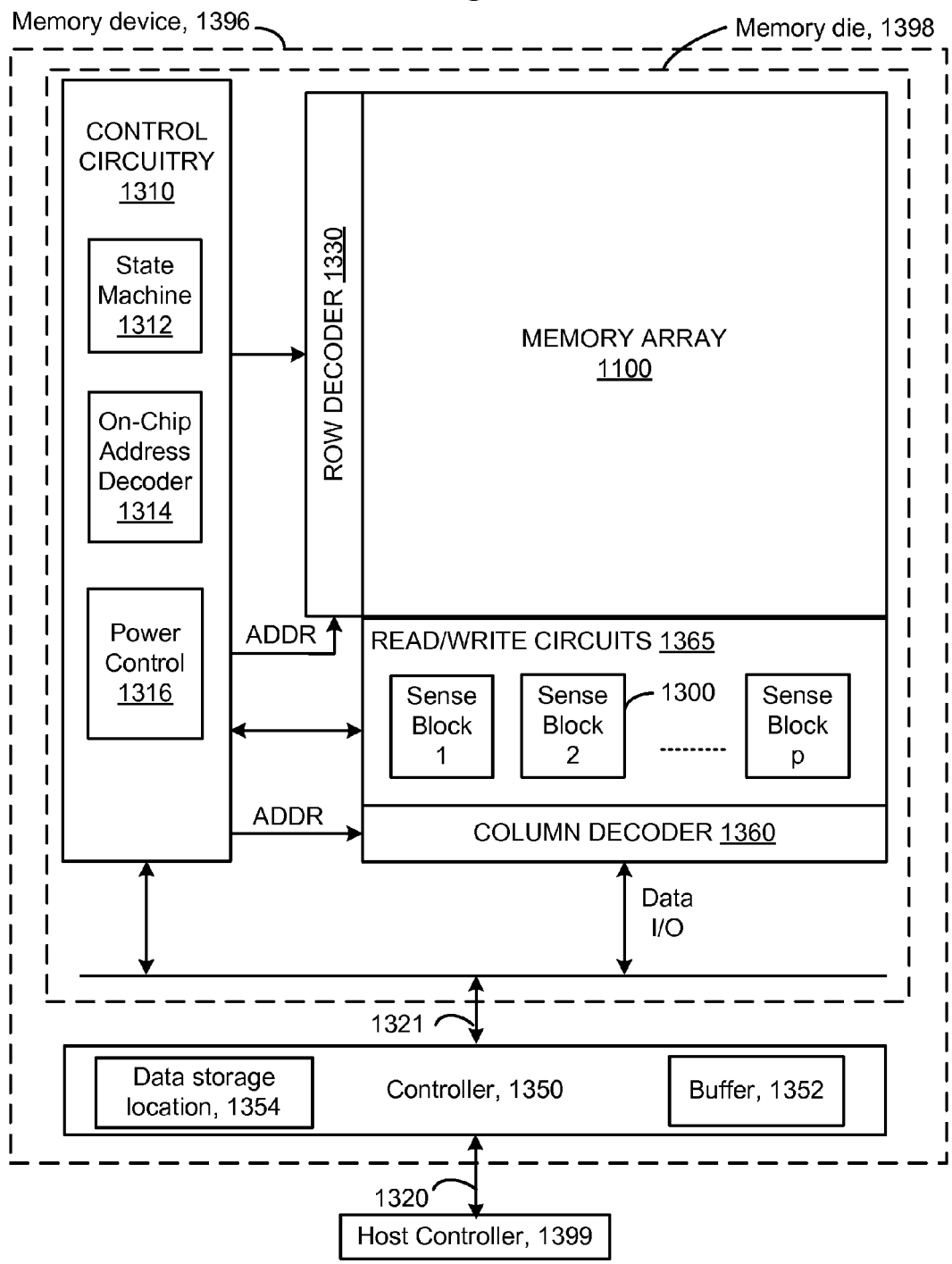
FIG. 13 is a block diagram of a non-volatile memory system using single row/column decoders and read/write circuits.

FIG. 13 is a block diagram of a non-volatile memory system using single row/column decoders and read/write circuits. The diagram illustrates a memory device 1396 having read/write circuits for reading and programming a page of storage elements in parallel, according to one embodiment of the present invention. Memory device 1396 may include one or more memory die 1398. Memory die 1398 includes a two-dimensional array of storage elements 1400, control circuitry 1310, and read/write circuits 1365. In some embodiments, the array of storage elements can be three dimensional. The memory array 1400 is addressable by word lines via a row decoder 1330 and by bit lines via a column decoder 1360. The read/write circuits 1365 include multiple sense blocks 1300 and allow a page of storage elements to be read or programmed in parallel. Typically a controller 1350 is included in the same memory device 1396 (e.g., a removable storage card) as the one or more memory die 1398. Commands and Data are transferred between the host and controller 1350 via lines 1320 and between the controller and the one or more memory die 1398 via lines 1321.

The control circuitry 1310 cooperates with the read/write circuits 1365 to perform memory operations on the memory array 1100. The control circuitry 1310 includes a state machine 1312, an on-chip address decoder 1314 and a power control module 1316. The state machine 1312 provides chip-level control of memory operations. For example, the state machine may be configured to perform the read and verify processed discussed previously. The on-chip address decoder 1314 provides an address interface between that used by the host or a memory controller to the hardware address used by the decoders 1330 and 1360. The power control module 1316 controls the power and voltages supplied to the word lines and bit lines during memory operations. For example, the power control module 1316 can provide a control gate read voltage to a selected word line, and read pass voltages to unselected word lines, for use during read operations and in determining a threshold voltage distribution of a set of storage elements. The power control module 1316 may include one or more digital-to-analog converters, for instance.

In some implementations, some of the components of FIG. 13 can be combined. In various designs, one or more of the components (alone or in combination), other than storage element array 1100, can be thought of as a managing or control circuit. For example, one or more managing or control circuits may include any one of, or a combination of, control circuitry 1310, state machine 1312, decoders 1314/1360, power control 1316, sense blocks 1300, read/write circuits 1365, controller 1350, host controller 1399, etc.

The data stored in the memory array is read out by the column decoder 1360 and output to external I/O lines via the data I/O line and a data input/output buffer 1352. Program data to be stored in the memory array is input to the data input/output buffer 1352 via the external I/O lines. Command data for controlling the memory device are input to the controller 1350. The command data informs the flash memory of what operation is requested. The input command is transferred to the control circuitry 1310. The state machine 1312 can output a status of the memory device such as READY/BUSY or PASS/FAIL. When the memory device is busy, it cannot receive new read or write commands.

A data storage location 1354, analogous to the storage location 1215 of FIG. 12, may also be provided in connection with the controller 1350.

In another possible configuration, a non-volatile memory system can use dual row/column decoders and read/write circuits. In this case, access to the memory array by the various peripheral circuits is implemented in a symmetric fashion, on opposite sides of the array, so that the densities of access lines and circuitry on each side are reduced by half.

The foregoing detailed description of the invention has been presented for purposes of illustration and description. It is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
   receiving a read command for a selected word line, the selected word line is in communication with a set of non-volatile storage elements along the selected word line, different first and second subsets of non-volatile storage elements are in communication with the selected word line, and one end of the selected word line is closer to the first subset of non-volatile storage elements than to the second subset of non-volatile storage elements; and
   in response to the read command:
      identifying the first subset of non-volatile storage elements as including data which is requested by the read command;
      applying a control gate voltage to the one end of the selected word line, the control gate voltage requires a finite propagation time to propagate throughout the selected word line;
      determining a time for activating sense components of the first subset of non-volatile storage elements based on the identifying;
      activating the sense components for the first subset of non-volatile storage elements at the determined time, the determined time is after the control gate voltage has propagated along the selected word line enough to reach all of the non-volatile storage elements in the first subset of non-volatile storage elements; and
      activating sense components for the second subset of non-volatile storage elements before the control gate voltage has propagated along the selected word line enough to reach all of the non-volatile storage elements in the second subset of non-volatile storage elements.

2. The method of claim 1, wherein:
the read command requests data stored by the first subset of non-volatile storage elements but not the second subset of non-volatile storage elements.

3. The method of claim 1, further comprising:
discarding data sensed from the second subset of non-volatile storage elements.

4. The method of claim 1, wherein:
the sense components of the first and second subsets of non-volatile storage elements are activated concurrently.

5. The method of claim 1, wherein:
the first subset of non-volatile storage elements stores bits of an entire page of data.

6. The method of claim 1, wherein:
the first subset of non-volatile storage elements stores bits of less than an entire page of data.

7. The method of claim 1, further comprising:
concurrently activating sense components for all non-volatile storage elements which are in communication with the selected word line.

8. The method of claim 1, wherein, while the control gate voltage is applied to the one end of the selected word line:
   sense components of all odd numbered non-volatile storage elements with which the selected word line is in communication are activated concurrently at a first time; and
   sense components of all even numbered non-volatile storage elements with which the selected word line is in communication are activated concurrently at a second time.

9. The method of claim 1, wherein:
   each sense component of the first subset of non-volatile storage elements comprises a sense amplifier, and each sense amplifier of the first subset of non-volatile storage elements is in communication with a respective non-volatile storage element of the first subset of non-volatile storage elements via a respective bit line;
   each sense component of the second subset of non-volatile storage elements comprises a sense amplifier, and each sense amplifier of the second subset of non-volatile storage elements is in communication with a respective non-volatile storage element of the second subset of non-volatile storage elements via a respective bit line;
   the activating sense components for the first subset of non-volatile storage elements comprises activating the sense amplifiers of the first subset of non-volatile storage elements; and
   the activating sense components for the second subset of non-volatile storage elements comprises activating the sense amplifiers of the second subset of non-volatile storage elements.

10. The method of claim 1, wherein:
the activating sense components of the first subset of non-volatile storage elements and the activating sense components of the second subset of non-volatile storage elements occur as part of a verify operation during a programming process, and the control gate voltage is a single verify voltage.

11. The method of claim 1, wherein:
the activating sense components of the first subset of non-volatile storage elements and the activating sense components of the second subset of non-volatile storage elements occur as part of a read operation after a programming process, and the control gate voltage is a single read voltage.

12. The method of claim 1, wherein:
the sense components for the first subset of non-volatile storage elements are activated before the control gate voltage has propagated throughout the selected word line.

13. The method of claim 1, wherein:
the control gate voltage comprises a single read voltage; and
the activating sense components of the first subset of non-volatile storage elements determines whether a respective threshold voltage of each non-volatile storage element in the first subset of non-volatile storage elements is above or below the single read voltage.

14. The method of claim 1, wherein:
the control gate voltage is considered to have propagated along the selected word line enough to reach all of the non-volatile storage elements in the first subset of non-volatile storage elements when the control gate voltage has reached within a tolerance of a steady state level at a location along the selected word line, the location is at a non-volatile storage element of the first subset of non-volatile storage elements which is furthest from the one end of the selected word line.

15. The method of claim 1, wherein:
the control voltage settles at progressively increasing times at progressively increasing distances from the one end of the selected word line; and
the activating of the sense components for the second subset of non-volatile storage elements occurs without waiting for the control gate voltage to settle throughout the selected word line.

16. An apparatus which performs the method of claim 1.

17. A method for operating non-volatile storage, comprising:
receiving a read command for a selected word line, the selected word line is in communication with a set of non-volatile storage elements along the selected word line, different first and second subsets of non-volatile storage elements are in communication with the selected word line, and one end of the selected word line is closer to the first subset of non-volatile storage elements than to the second subset of non-volatile storage elements; and
in response to the read command:
identifying the first subset of non-volatile storage elements as including data which is requested by the read command;
applying a control gate voltage to the one end of the selected word line, the control gate voltage requires a finite propagation time to propagate and settle throughout the selected word line;
determining a specified time for activating sense components of the first subset of non-volatile storage elements based on the identifying; and
at the specified time, when the control gate voltage has propagated and settled along the selected word line for all of the non-volatile storage elements in the first subset of non-volatile storage elements, but before the finite propagation time, initiating a sensing process which determines whether each non-volatile storage element of the first subset of non-volatile storage elements is conductive.

18. The method of claim 17, further comprising:
before the finite propagation time, initiating a sensing process which determines whether each non-volatile storage element of the second subset of non-volatile storage elements is conductive.

19. An apparatus which performs the method of claim 17.

* * * * *